United States Patent
Chen et al.

(10) Patent No.: US 10,256,926 B2
(45) Date of Patent: Apr. 9, 2019

(54) METHOD FOR CONFIGURING A COMMUNICATION SYSTEM

(71) Applicant: MICROELECTRONICS TECHNOLOGY, INC., Hsinchu (TW)

(72) Inventors: Ruei-Yuen Chen, Toufen Township (TW); Hsiang-Hao Sung, Zhunan Township (TW)

(73) Assignee: MICROELECTRONICS TECHNOLOGY, INC, Hsinchu (TW)

( * ) Notice: Subject to any disclaimer, the term of this patent is extended or adjusted under 35 U.S.C. 154(b) by 0 days.

(21) Appl. No.: 15/943,458

(22) Filed: Apr. 2, 2018

(65) Prior Publication Data

US 2019/0058531 A1    Feb. 21, 2019

Related U.S. Application Data

(60) Provisional application No. 62/546,804, filed on Aug. 17, 2017.

(51) Int. Cl.
| | |
|---|---|
| *H04B 17/00* | (2015.01) |
| *H04B 17/21* | (2015.01) |
| *H04B 17/318* | (2015.01) |
| *H04B 1/04* | (2006.01) |
| *H03F 1/30* | (2006.01) |

(52) U.S. Cl.
CPC .............. *H04B 17/21* (2015.01); *H04B 1/04* (2013.01); *H04B 17/318* (2015.01); *H03F 1/30* (2013.01); *H04B 2001/0416* (2013.01)

(58) Field of Classification Search
CPC .................. H04B 17/21; H04B 17/318; H04B 2001/0416; H03F 1/30
USPC .......... 455/423, 67.11, 115.1, 226.1
See application file for complete search history.

(56) References Cited

U.S. PATENT DOCUMENTS

| | | | |
|---|---|---|---|
| 8,909,133 B2 * | 12/2014 | Hobbs | H04B 7/15535 455/8 |
| 8,971,818 B2 * | 3/2015 | Maaref | H04W 16/10 375/224 |
| 8,995,288 B2 * | 3/2015 | Karaoguz | H04B 1/40 370/252 |

* cited by examiner

*Primary Examiner* — Sonny Trinh
(74) *Attorney, Agent, or Firm* — Muncy, Geissler, Olds & Lowe, P.C.

(57) ABSTRACT

The present disclosure provides a method for configuring a communication system with a variable attenuator. The method includes measuring a first attenuation accuracy of the communication system at a first attenuation rate of the variable attenuator, and setting the variable attenuator based on the first attenuation accuracy so that the variable attenuator has a second attenuation rate and the communication system has a second attenuation accuracy. The method further includes obtaining a plurality of first gains at first temperatures and first frequencies, and performing an interpolation process to obtain, from the plurality of first gains, a plurality of second gains at second temperatures and/or second frequencies. The method also includes building a three-dimensional gain table with respect to the temperature, the frequency and the attenuation rate.

24 Claims, 7 Drawing Sheets

METHOD FOR CONFIGURING A COMMUNICATION SYSTEM

PRIORITY CLAIM AND CROSS-REFERENCE

This application claims priority of U.S. provisional application Ser. No. 62/546,804, filed on Aug. 17, 2017, which is incorporated herein by reference in its entirety.

TECHNICAL FIELD

The present disclosure relates to a method for configuring a communication system.

DISCUSSION OF THE BACKGROUND

Radio frequency communication systems are widely deployed to provide various communication content such as voice, video, packet data, messaging, and broadcast programming. These radio frequency systems may be multiple-access systems capable of supporting multiple users by sharing the available system resources. Examples of such multiple-access systems include Code Division Multiple Access (CDMA) systems, Time Division Multiple Access (TDMA) systems, Frequency Division Multiple Access (FDMA) systems, Orthogonal FDMA (OFDMA) systems, and Single-Carrier FDMA (SC-FDMA) systems.

Modern communication systems require a gain reporting function to realize optimal system performance in areas such as power adjustment and BER (bit error rate). When the communication system implements a high-level protocol, more accurate real-time gain reporting is required to achieve a higher BER performance.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for configuring a communication system with a variable attenuator. The method comprises the steps of measuring a first attenuation accuracy of the communication system at a first attenuation rate of the variable attenuator, and setting the variable attenuator based on the first attenuation accuracy so that the variable attenuator has a second attenuation rate and the communication system has a second attenuation accuracy; obtaining a plurality of first gains at first temperatures and first frequencies, and performing an interpolation process to obtain a plurality of second gains at second temperatures and/or second frequencies from the plurality of first gains; and building a three-dimensional gain table with respect to the temperature, the frequency and the attenuation rate.

Another aspect of the present disclosure provides a method for configuring a communication system with at least one gain variable device. The method comprises the steps of measuring a first attenuation accuracy of the communication system, and setting the gain variable device based on the first attenuation accuracy so that the communication system has a second attenuation accuracy; obtaining a plurality of first gains at first temperatures and first frequencies, and performing an interpolation process to obtain a plurality of second gains at second temperatures and/or second frequencies from the plurality of first gains; and building a three-dimensional gain table with respect to the temperature, the frequency and the attenuation accuracy.

In some embodiments of the present disclosure, the first attenuation rate is zero, the first attenuation accuracy deviates from zero by a first value, the second attenuation accuracy deviates from zero by a second value, and the second value is smaller than the first value.

In some embodiments of the present disclosure, the plurality of first temperatures are not equally spaced.

In some embodiments of the present disclosure, the plurality of first temperatures are −40° C., 20° C., and 55° C.

In some embodiments of the present disclosure, the plurality of second temperatures are not equally spaced.

In some embodiments of the present disclosure, the plurality of second temperatures are −20° C., 0° C., and 40° C.

In some embodiments of the present disclosure, the interpolation process comprises generating a nonlinear function to fit the first gains at first temperatures.

In some embodiments of the present disclosure, the nonlinear function is a spline function.

In some embodiments of the present disclosure, the nonlinear function is a circular function.

In some embodiments of the present disclosure, the nonlinear function includes two circular functions.

In some embodiments of the present disclosure, the first frequencies are not equally spaced.

In some embodiments of the present disclosure, the step of measuring a plurality of first gains comprises: setting a plurality of temperature nodes in an operation range; performing a gain-measuring process at a minimum temperature node, a maximum temperature node, and an intermediate temperature node; and generating a non-linear function fitting the first gains at the minimum temperature node, the maximum temperature node, and the intermediate temperature node.

In some embodiments of the present disclosure, the interpolation process comprises obtaining the plurality of second gains at a lower interpolated temperature node and a higher interpolated temperature node, the lower interpolated temperature node is between the minimum temperature node and the intermediate temperature node, and the higher interpolated temperature node is between the maximum temperature node and the intermediate temperature node.

In some embodiments of the present disclosure, the step of measuring a plurality of first gains comprises: setting a plurality of equally-spaced frequency nodes in a communication band; performing a gain-measuring process at a minimum frequency node, a maximum frequency node, and two intermediate frequency nodes; and generating a linear function fitting the first gains at the minimum frequency node, the maximum frequency node, and the two middle frequency nodes.

In some embodiments of the present disclosure, the interpolation process comprises obtaining the plurality of second gains at a lower interpolated frequency node and a higher interpolated frequency node, the lower interpolated frequency node is between the minimum frequency node and one of the two intermediate frequency nodes, and the higher interpolated frequency node is between the maximum frequency node and the other one of the two intermediate frequency nodes.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a method for configuring a communication system. In order to make the present disclosure completely comprehensible, detailed steps and structures are provided in the following description. Obviously, the implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
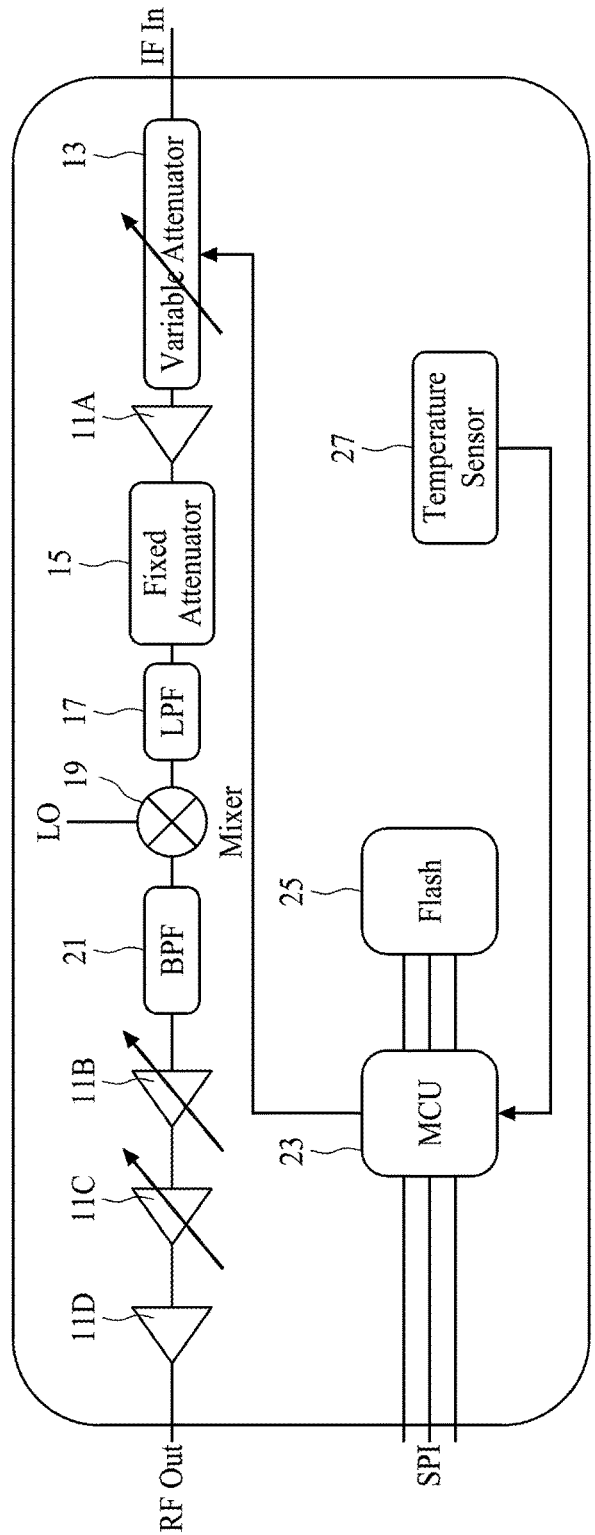
FIG. 1 is a schematic diagram showing a communication system in accordance with embodiments of the present disclosure.

FIG. 1 is a schematic diagram showing a communication system 10 in accordance with embodiments of the present disclosure. In some embodiments, the communication system 10 comprises a plurality of amplifiers 11A-11D, a variable attenuator 13, a fixed attenuator 15, a low pass filter (LPF) 17, a mixer 19, a band pass filter (BPF) 21, a micro-controlling unit (MCU), 23, a memory 25 such as a flash memory, and a temperature sensor 27.

Figure 2:
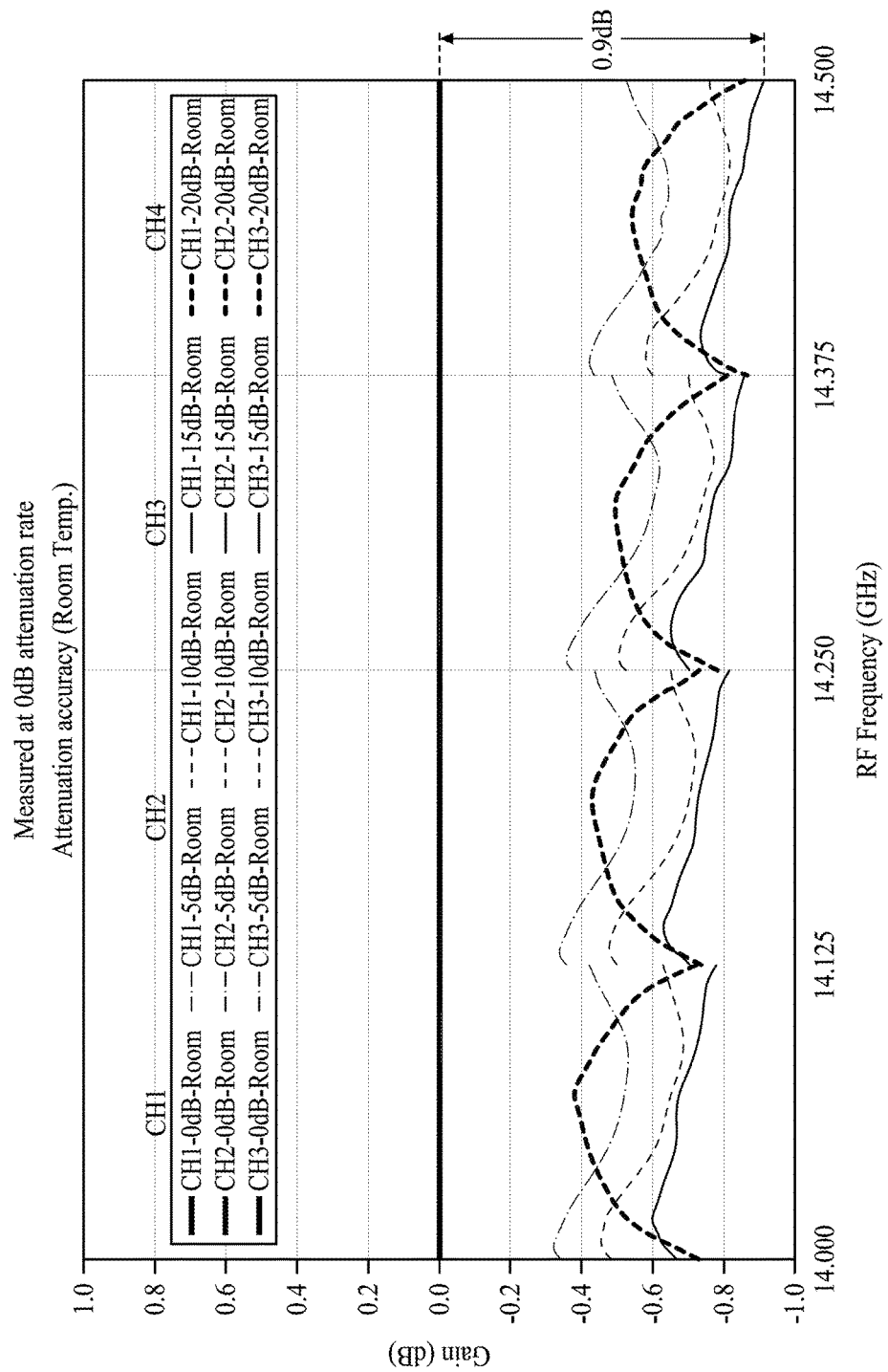
FIG. 2 and FIG. 3 are plots showing the configuring of the variable attenuator of the communication system in accordance with embodiments of the present disclosure.
Figure 3:
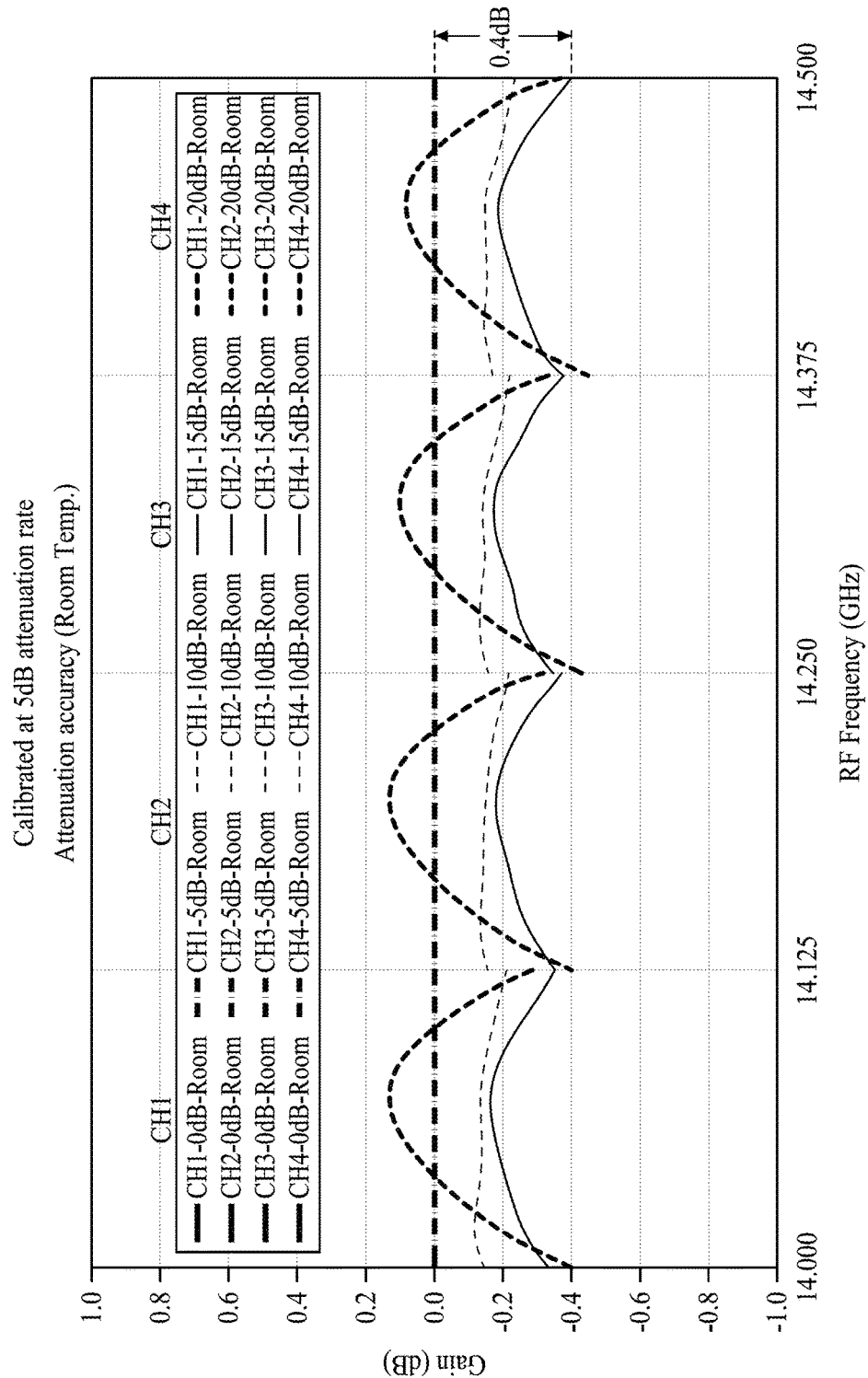

FIG. 2 and FIG. 3 are plots showing the configuring of the communication system 10 in accordance with embodiments of the present disclosure. In some embodiments of the present disclosure, the configuring of the communication system 10 comprises measuring a first attenuation accuracy of the communication system 10 at a first attenuation rate of the variable attenuator 13, as shown in FIG. 2. In some embodiments of the present disclosure, the configuring of the communication system 10 further comprises setting the variable attenuator 13 based on the first attenuation accuracy so that the variable attenuator 13 has a second attenuation rate and the communication system 10 has a second attenuation accuracy, as shown in FIG. 3.

In some embodiments of the present disclosure, the communication system 10 comprises at least one gain variable device such as the amplifiers 11B and 11C, and the configuring of the communication system 10 comprises setting the gain variable device based on the first attenuation accuracy so that the communication system has a second attenuation accuracy, e.g., adjusting the biasing voltage of the amplifiers 11B and 11C so as to change the gain (and attenuation accuracy) of the communication system 10.

In some embodiments of the present disclosure, the variable attenuator 13 includes electronic devices with different impedances to construct a T-type or Π-type structure, and the attenuation rate can be adjusted by changing the impedance of the electronic devices such as resistors, MOS transistors or bipolar transistors.

In some embodiments of the present disclosure, the first attenuation rate is zero (0 dB), the first attenuation accuracy is smaller than zero (0 dB), and the first attenuation accuracy is about 0.9 dB, as shown in FIG. 2. In contrast, after setting the variable attenuator 13 based on the first attenuation accuracy to have a second attenuation rate (e.g., 5 dB) at which the communication system 10 has a second attenuation accuracy about 0.4 dB, as shown in FIG. 3. The first attenuation rate is zero, the first attenuation accuracy deviates from zero by a first value (0.9 dB), the second attenuation accuracy deviates from zero by a second value (0.4 dB), and the second value is smaller than the first value.

Figure 4:
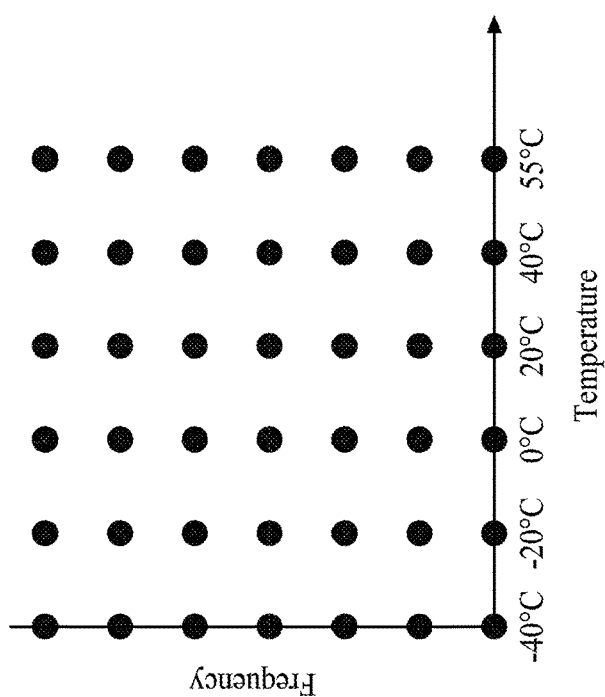
FIG. 4 is a plot showing a two-dimensional gain table for configuring the communication system in accordance with embodiments of the present disclosure.

FIG. 4 is a plot showing a two-dimensional gain table for configuring the communication system 10 in accordance with embodiments of the present disclosure. Modem communication systems require a real-time accurate gain reporting function to achieve optimal system performance. The implementation of the gain reporting function requires that gain measurements be performed over a plurality of frequencies and temperatures. Referring to the illustration in FIG. 4, in order to obtain accurate results, it is necessary to measure as many nodes as possible. However, the gain measurements are very time-consuming.

Figure 5:
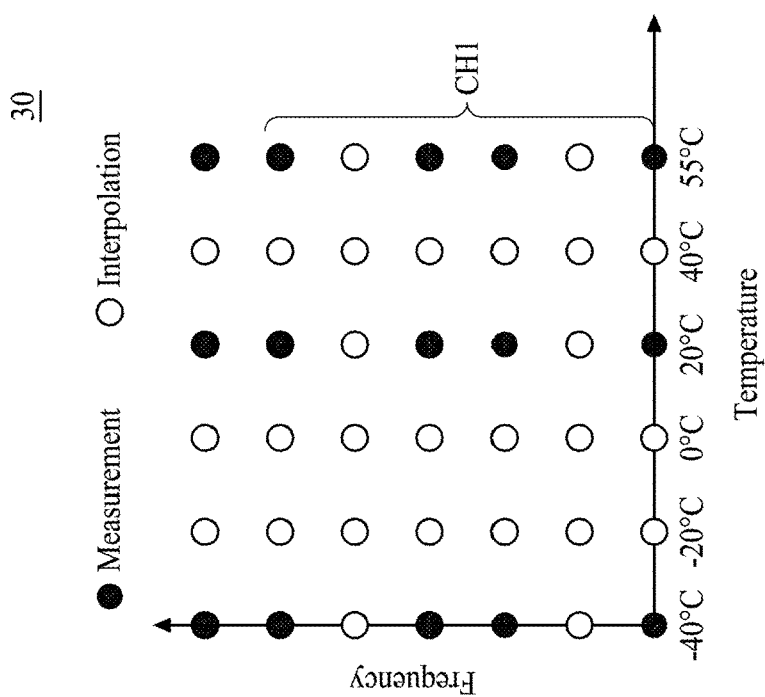
FIG. 5 is a plot showing a two-dimensional gain table with measurement nodes and interpolation nodes for configuring the communication system in accordance with embodiments of the present disclosure.

FIG. 5 is a plot showing a two-dimensional gain table 30 with measurement nodes and interpolation nodes for configuring the communication system 10 in accordance with embodiments of the present disclosure. In some embodiments of the present disclosure, the configuring of the communication system 10 comprises obtaining a plurality of first gains at first temperatures and first frequencies, and performing an interpolation process to obtain, from the plurality of first gains, a plurality of second gains at second temperatures and/or second frequencies. In some embodiments of the present disclosure, the measurement nodes in FIG. 4 are divided into two groups, as shown in FIG. 5, which presents one measurement group and one interpolation group.

In some embodiments of the present disclosure, gain measurements are performed at the measurement nodes of the measurement group to obtain a plurality of first gains at first temperatures and first frequencies, and an interpolation process is then performed to obtain, from the plurality of first gains, a plurality of second gains at second temperatures and/or second frequencies. The interpolation nodes of the interpolation group correspond to the second temperatures and/or second frequencies, and the first gains and the second gains form the two-dimensional gain table 30.

In some embodiments of the present disclosure, the first temperatures at the measurement nodes of the measurement group are not equally spaced, e.g., the first temperatures are −40° C., 20° C., and 55° C. In some embodiments of the present disclosure, the second temperatures at the interpolation nodes of the interpolated group are not equally spaced, e.g., the second temperatures are −20° C., 0° C., and 40° C.

Figure 7:
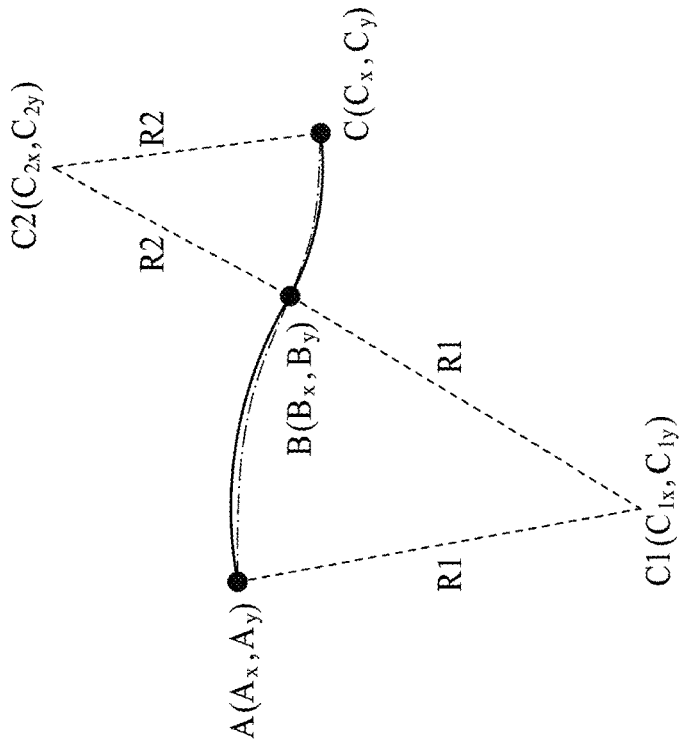
FIGS. 6 and 7 are schematic diagrams showing the curve fittings of the first gains with respect to the temperatures in accordance with embodiments of the present disclosure.
Figure 6:
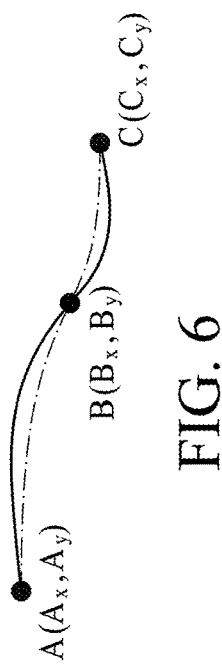

FIGS. 6 and 7 are schematic diagrams showing the curve fitting of the first gains with respect to the temperatures in accordance with embodiments of the present disclosure. In some embodiments of the present disclosure, the interpolation process comprises generating a nonlinear function to fit the first gains at first temperatures (the measurement nodes A, B and C; e.g., −40° C., 20° C., and 55° C.).

Referring to FIG. 6, the first gains at the measurement nodes A, B and C (e.g., −40° C., 20° C., and 55° C.) are obtained by actual measurements. Next, a spline function can be used to fit the first gains at the measurement nodes A, B and C. Consequently, the second gains at the interpolation nodes (e.g., −20° C., 0° C., and 40° C.), which are different from the measurement nodes A, B and C, can be obtained from the interpolation of the spline function. In some embodiments, the spline function has a form $y=a+bx+cx^2+dx^3$, wherein a, b, c, d are constants, x represents temperature, y represents frequency, and a, b, c and d can be calculated from $A_x$, $A_y$, $B_x$, $B_y$, $C_x$, and $C_y$.

Referring to FIG. 7, the first gains at the measurement nodes A, B and C (e.g., −40° C., 20° C., and 55° C.) are obtained by actual measurements. Next, two circular functions can be used to fit the first gains at the measurement nodes A, B and C. For example, a first circular function with a first center C1 is used to fit the measurement nodes A and B, while a second circular function with a second center C2 is used to fit the measurement nodes B and C. Consequently, the second gains at the interpolation nodes (e.g., −20° C., 0° C., and 40° C.), which are different from the measurement nodes A, B and C, can be obtained from the interpolation of the two circular functions. In some embodiments, the circular function has a form $(x-C_{1x})^2+(y-C_{1y})^2=(R1)^2$, wherein $C_{1x}$, $C_{1y}$, and R1 are constants, x represents temperature, y represents frequency, and $C_1x$ and $C_1y$ can be calculated from $A_x$, $A_y$, $B_x$, and $B_y$.

In some embodiments of the present disclosure, obtaining the plurality of first gains at the plurality of first temperatures includes: setting a plurality of temperature nodes (e.g., −40° C., −20° C., 0° C., 20° C., 40° C., and 55° C.) in a temperature range (e.g., between −40° C. and 55° C.); performing a gain-measuring process at a minimum temperature node (e.g., −40° C.), a maximum temperature node (e.g., 55° C.), and an intermediate temperature node (e.g., 20° C.); and generating a non-linear function fitting the first gains at the minimum temperature node, the maximum temperature node, and the intermediate temperature node. Consequently, the second gains at the interpolation nodes (e.g., −20° C., 0° C., and 40° C.), which are different from the measurement nodes (e.g., −40° C., 20° C., and 55° C.), can be obtained from the interpolation of the non-linear function.

Figure 8:
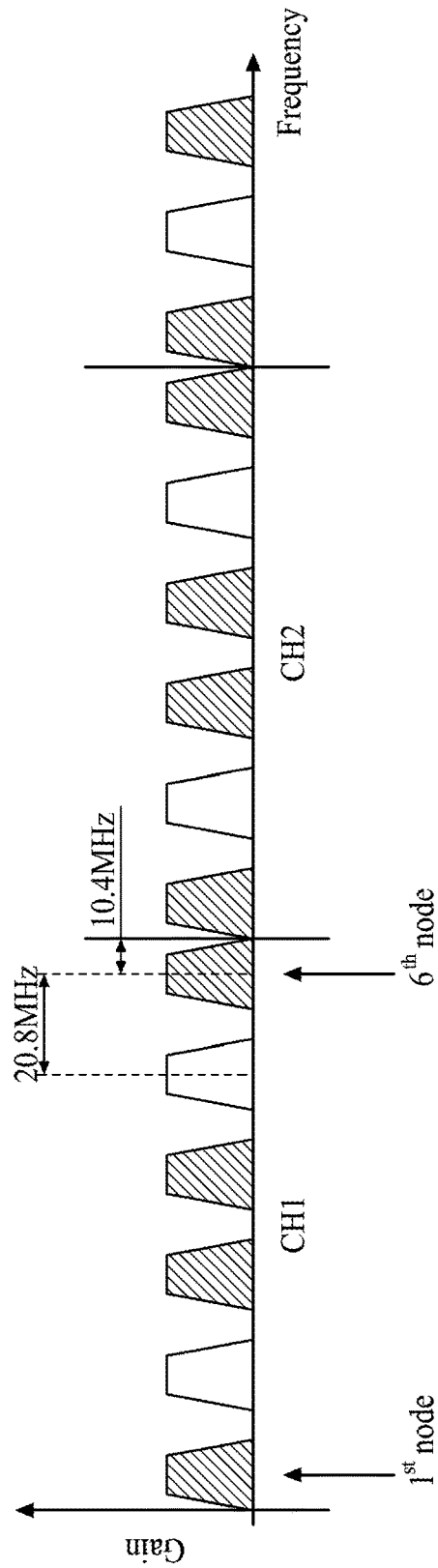
FIG. 8 is a schematic diagram showing the obtaining of the first gains with respect to frequencies in accordance with embodiments of the present disclosure.

FIG. 8 is a schematic diagram showing the obtaining of the first gains with respect to frequencies in accordance with embodiments of the present disclosure. In some embodiments of the present disclosure, obtaining the plurality of first gains comprises setting a plurality of equally-spaced frequency nodes in a communication band, e.g., setting a plurality of equally-spaced frequency nodes (e.g., six nodes) in a communication band (CH1, channel 1), wherein the frequency nodes are equally spaced by 20.8 MHz.

In some embodiments of the present disclosure, obtaining the plurality of first gains comprises performing a gain-measuring process at a minimum frequency node, a maximum frequency node, and two intermediate frequency nodes. For example, the gain-measuring process is performed at the minimum frequency node ($1^{st}$ node), a maximum frequency node ($6^{th}$ node), and two intermediate frequency nodes ($3^{rd}$ and $4^{th}$ nodes).

In some embodiments of the present disclosure, obtaining the plurality of first gains comprises generating a linear function fitting the first gains at the minimum frequency node, the maximum frequency node, and the two middle frequency nodes. Subsequently, the interpolation process can be performed to obtain the plurality of second gains at a lower interpolated frequency node ($2^{nd}$ node) and a higher interpolated frequency node ($5^{th}$ node), wherein the lower interpolated frequency node is between the minimum frequency node and one of the two intermediate frequency nodes, and the higher interpolated frequency node is between the maximum frequency node and the other one of the two intermediate frequency nodes.

Figure 9:
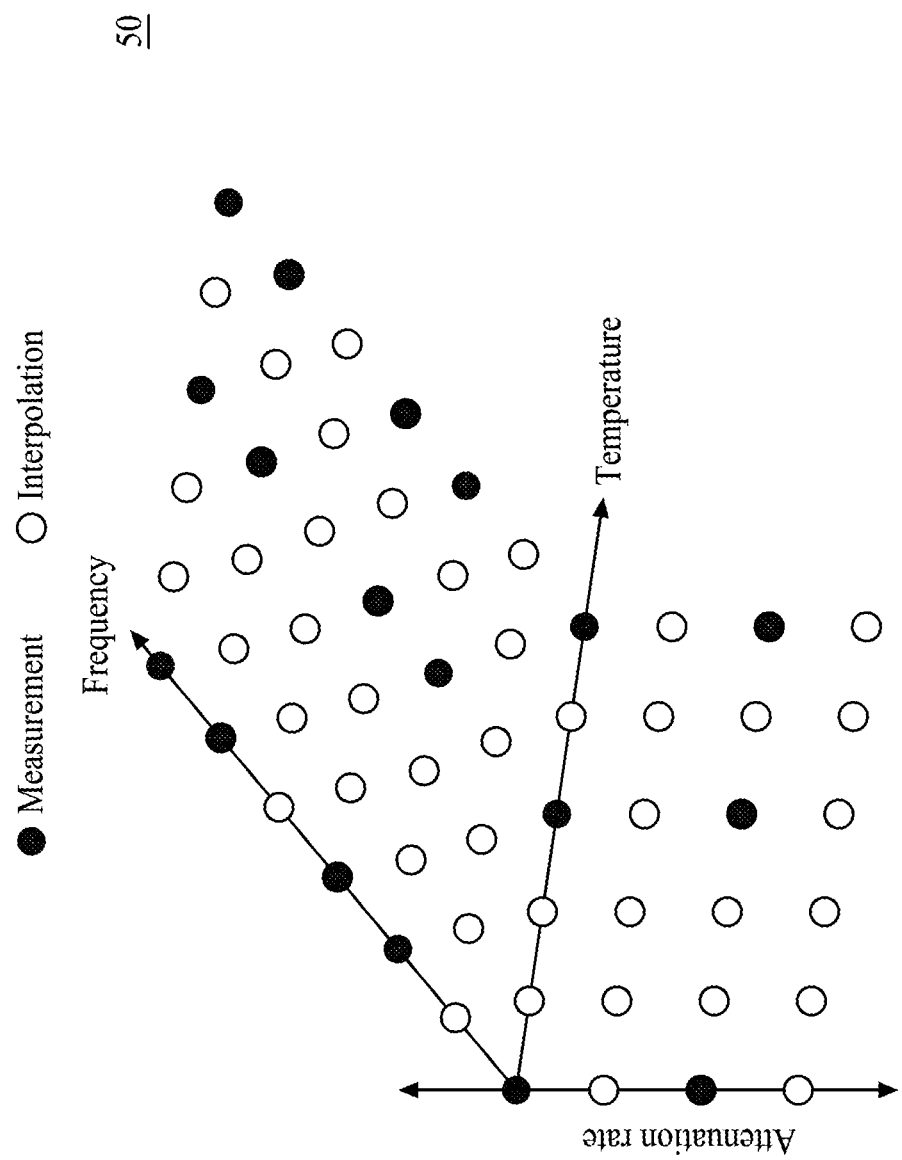
FIG. 9 is a plot showing a three-dimensional gain table in accordance with embodiments of the present disclosure.

FIG. 9 is a plot showing a three-dimensional gain table 50 in accordance with embodiments of the present disclosure. In some embodiments of the present disclosure, the configuring of the communication system 10 comprises building the three-dimensional gain table 50 with respect to the temperature, the frequency and the attenuation rate. In some embodiments of the present disclosure, the gains obtained by measurements at different attenuation rates in FIG. 9 correspond to the plots shown in FIGS. 2 and 3, the gains obtained by measurements at different temperatures and frequencies in FIG. 9 correspond to the plot shown in FIG. 5, and the gains obtained by interpolations at different temperatures and frequencies in FIG. 9 correspond to the plots shown in FIGS. 6 and 7.

In some embodiments of the present disclosure, the three-dimensional gain table 50 is stored in the memory 25 of the communication system 10 in FIG. 1. Subsequently, the MCU 23 can obtain the operating temperature of the communication system 10 from the temperature sensor 27, check the three-dimensional gain table 50 in view of the attenuation rate and the transmission frequency, and then configure the communication system 10 to have the desired gain by adjusting either the variable attenuator 13 or the amplifiers 11B and 11C.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for configuring a communication system, the communication system comprising a variable attenuator, the method comprising the steps of:
    measuring a first attenuation accuracy of the communication system at a first attenuation rate of the variable attenuator, and setting the variable attenuator based on the first attenuation accuracy so that the variable attenuator has a second attenuation rate and the communication system has a second attenuation accuracy;
    obtaining a plurality of first gains at first temperatures and first frequencies, and performing an interpolation process to obtain, from the plurality of first gains, a plurality of second gains at second temperatures and/or second frequencies; and
    building a three-dimensional gain table with respect to the temperature, the frequency and the attenuation rate.

2. The method of claim 1, wherein the first attenuation rate is zero, the first attenuation accuracy deviates from zero by a first value, the second attenuation accuracy deviates from zero by a second value, and the second value is smaller than the first value.

3. The method of claim 1, wherein the first temperatures are not equally spaced.

4. The method of claim 1, wherein the second temperatures are not equally spaced.

5. The method of claim 1, wherein the interpolation process comprises generating a nonlinear function to fit the first gains at first temperatures.

6. The method of claim 5, wherein the nonlinear function is a spline function.

7. The method of claim 5, wherein the nonlinear function includes two circular functions.

8. The method of claim 1, wherein the first frequencies are not equally spaced.

9. The method of claim 1, wherein the step of obtaining a plurality of first gains comprises:
    setting a plurality of temperature nodes in a temperature range;
    performing a gain-measuring process at a minimum temperature node, a maximum temperature node, and an intermediate temperature node; and
    generating a non-linear function fitting the first gains at the minimum temperature node, the maximum temperature node, and the intermediate temperature node.

10. The method of claim 9, wherein the interpolation process comprises obtaining the plurality of second gains at a lower interpolated temperature node and a higher interpolated temperature node, wherein the lower interpolated temperature node is between the minimum temperature node and the intermediate temperature node, and the higher interpolated temperature node is between the maximum temperature node and the intermediate temperature node.

11. The method of claim 1, wherein the step of obtaining a plurality of first gains comprises:
    setting a plurality of equally-spaced frequency nodes in a communication band;
    performing a gain-measuring process at a minimum frequency node, a maximum frequency node, and two intermediate frequency nodes; and
    generating a linear function fitting the first gains at the minimum frequency node, the maximum frequency node, and the two middle frequency nodes.

12. The method of claim 11, wherein the interpolation process comprises obtaining the plurality of second gains at a lower interpolated frequency node and a higher interpolated frequency node, wherein the lower interpolated frequency node is between the minimum frequency node and one of the two intermediate frequency nodes, and the higher interpolated frequency node is between the maximum frequency node and the other one of the two intermediate frequency nodes.

13. A method for configuring a communication system, the communication system comprising at least one gain variable device, the method comprising the steps of:
    measuring a first attenuation accuracy of the communication system, and setting the gain variable device based on the first attenuation accuracy so that the communication system has a second attenuation accuracy;
    obtaining a plurality of first gains at first temperatures and first frequencies, and performing an interpolation process to obtain, from the plurality of first gains, a plurality of second gains at second temperatures and/or second frequencies; and
    building a three-dimensional gain table with respect to the temperature, the frequency and the attenuation accuracy.

14. The method of claim 13, wherein the first attenuation accuracy deviates from zero by a first value, the second attenuation accuracy deviates from zero by a second value, and the second value is smaller than the first value.

15. The method of claim 13, wherein the first temperatures are not equally spaced.

16. The method of claim 13, wherein the second temperatures are not equally spaced.

17. The method of claim 13, wherein the interpolation process comprises generating a nonlinear function to fit the first gains at first temperatures.

18. The method of claim 17, wherein the nonlinear function is a spline function.

19. The method of claim 18, wherein the nonlinear function includes two circular functions.

20. The method of claim 17, wherein the first frequencies are not equally spaced.

21. The method of claim 13, wherein the step of obtaining a plurality of first gains comprises:
    setting a plurality of temperature nodes in a temperature range;

performing a gain-measuring process at a minimum temperature node, a maximum temperature node, and an intermediate temperature node; and generating a non-linear function fitting the first gains at the minimum temperature node, the maximum temperature node, and the intermediate temperature node.

22. The method of claim 21, wherein the interpolation process comprises obtaining the plurality of second gains at a lower interpolated temperature node and a higher interpolated temperature node, wherein the lower interpolated temperature node is between the minimum temperature node and the intermediate temperature node, and the higher interpolated temperature node is between the maximum temperature node and the intermediate temperature node.

23. The method of claim 13, wherein the step of obtaining a plurality of first gains comprises:

setting a plurality of equally-spaced frequency nodes in a communication band;

performing a gain-measuring process at a minimum frequency node, a maximum frequency node, and two intermediate frequency nodes; and generating a linear function fitting the first gains at the minimum frequency node, the maximum frequency node, and the two middle frequency nodes.

24. The method of claim 23, wherein the interpolation process comprises obtaining the plurality of second gains at a lower interpolated frequency node and a higher interpolated frequency node, wherein the lower interpolated frequency node is between the minimum frequency node and one of the two intermediate frequency nodes, and the higher interpolated frequency node is between the maximum frequency node and the other one of the two intermediate frequency nodes.

* * * * *